(12) United States Patent
Lee et al.

(10) Patent No.: US 7,215,269 B2
(45) Date of Patent: May 8, 2007

(54) DELTA-SIGMA ANALOG-TO-DIGITAL CONVERTER SUITABLE FOR USE IN A RADIO RECEIVER CHANNEL

(75) Inventors: Wai L. Lee, Austin, TX (US); Xudong Zhao, Portland, OR (US); Amit Kumar, Beaverton, OR (US); Jianping Wen, Beaverton, OR (US); Garry N Link, Pacific City, OR (US)

(73) Assignee: Avnera Corporation, Beaverton, OR (US)

( * ) Notice: Subject to any disclaimer, the term of this patent is extended or adjusted under 35 U.S.C. 154(b) by 0 days.

(21) Appl. No.: 11/249,236

(22) Filed: Oct. 12, 2005

(65) Prior Publication Data
US 2007/0080843 A1    Apr. 12, 2007

(51) Int. Cl.
*H03M 3/00* (2006.01)
(52) U.S. Cl. .................. 341/143; 341/144; 341/155
(58) Field of Classification Search ............... 341/143, 341/144, 155
See application file for complete search history.

(56) References Cited

U.S. PATENT DOCUMENTS

| | | | |
|---|---|---|---|
| 6,160,859 A * | 12/2000 | Martin et al. ................ 375/345 |
| 6,304,608 B1 * | 10/2001 | Chen et al. ................ 375/252 |
| 6,384,761 B1 * | 5/2002 | Melanson ................ 341/143 |
| 6,674,381 B1 * | 1/2004 | Gomez et al. ............. 341/143 |
| 6,930,624 B2 * | 8/2005 | Hezar et al. ............... 341/143 |
| 7,034,731 B2 * | 4/2006 | Uramoto et al. ........... 341/143 |
| 2004/0057534 A1 * | 3/2004 | Masenten et al. .......... 375/316 |

* cited by examiner

*Primary Examiner*—Peguy JeanPierre
(74) *Attorney, Agent, or Firm*—Werner & Axenfeld, PC

(57) ABSTRACT

A radio receiver channel includes an analog front end and a digital signal processing section coupled together by an analog-to-digital converter (ADC) having a delta-sigma modulator coupled to a first digital decimation filter, which is coupled to second digital decimation filter, wherein the first decimation filter includes a source of finite impulse response coefficients coupled so as to provide a plurality of coefficients. The delta-sigma modulator includes a loop filter having a plurality of serially coupled integrators, and a multi-bit quantizer coupled to the loop filter; the multi-bit quantizer including an ADC operable to produce a multi-bit digital output signal, the ADC coupled to a DAC having dual DAC feedback loops, and a dynamic element matching function. In one embodiment, the delta-sigma modulator includes a fifth-order loop filter having five serially coupled integrators with a feedback path from the output to the input of the fifth integrator and a feedback path from the output to the input of the third integrator.

13 Claims, 16 Drawing Sheets

Receiver channel using a bandpass ΔΣ ADC

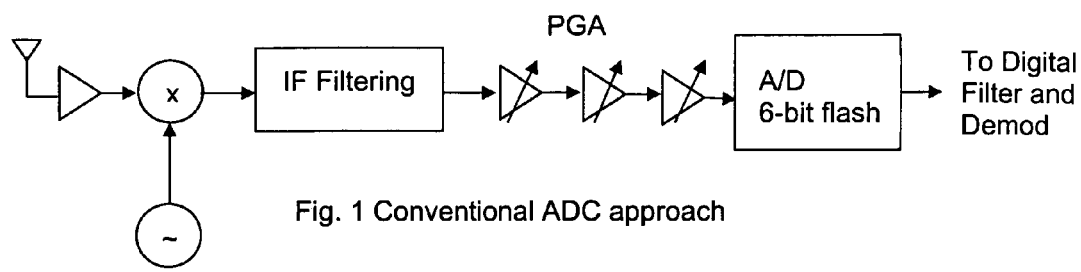
Fig. 1 Conventional ADC approach
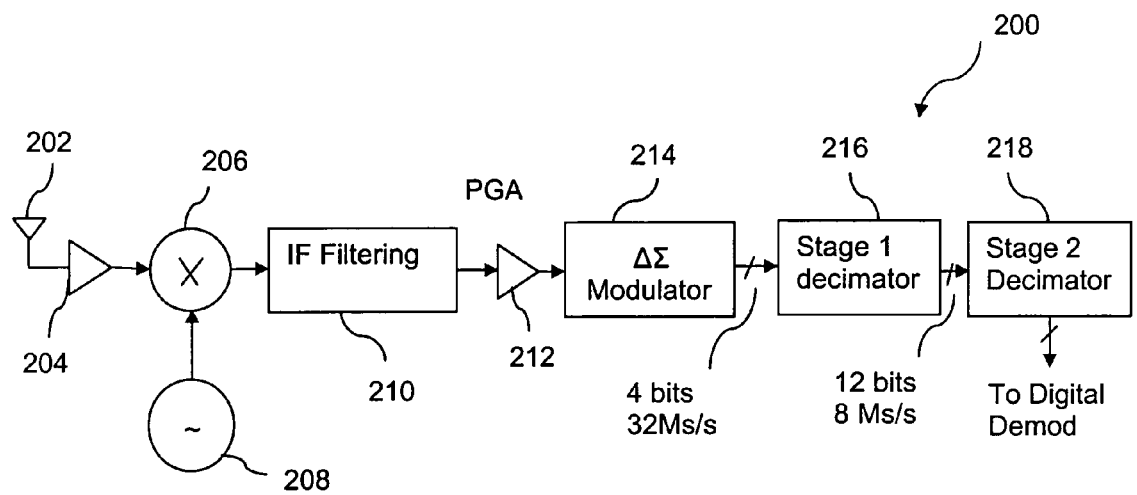
Fig. 2 Receiver channel using a bandpass ΔΣ ADC Figure 4: Stage 1 decimation filter response.

Figure 5: Stage 1 deimation filter passband details.

Fig. 11   I/O Diagram

ADC noise and interference requirement.

noise and interference power after filters.

Steps Involved in Dynamic Scaling

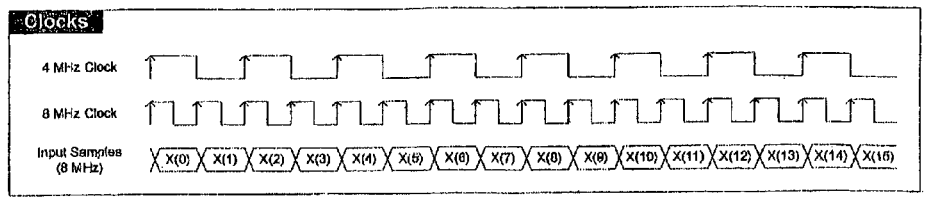
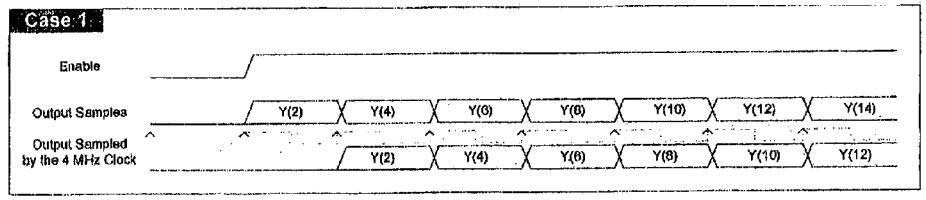
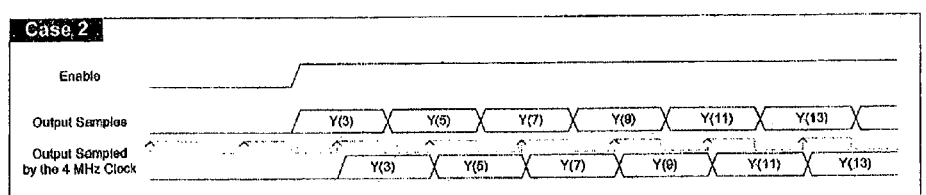
Fig. 17
Dependence of the latency of the 3$^{rd}$ stage filter on enable time
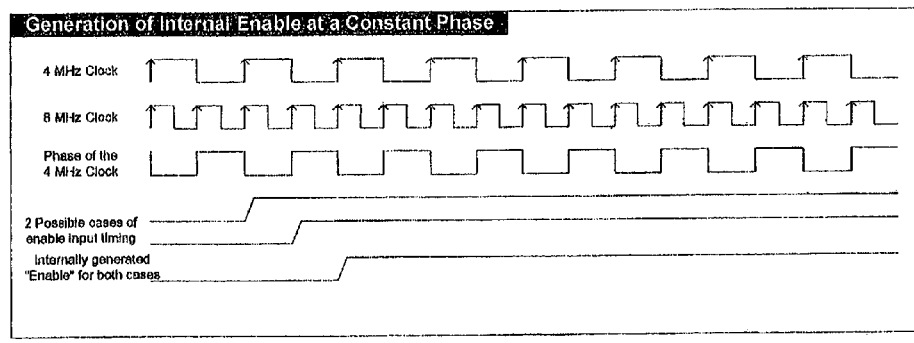
Fig. 18
Enabling at a fixed phase of the 4 MHz clock

DELTA-SIGMA ANALOG-TO-DIGITAL CONVERTER SUITABLE FOR USE IN A RADIO RECEIVER CHANNEL

FIELD OF THE INVENTION

The present invention relates generally to analog-to-digital converter (ADC) architectures and circuits, and relates more particularly, to a bandpass delta-sigma (ΔΣ) ADC suitable for receive channel intermediate frequency (IF) signal processing applications, and for use in such receive channels with digital decimation filters.

BACKGROUND

Advances in semiconductor manufacturing technology have resulted in the reduction in size of many circuit elements, including but not limited to transistors. In turn, these reductions in the physical dimensions of various circuit elements and interconnections has provided the capability to cost-effectively include very large numbers of interconnected circuit elements on integrated circuits, or chips. This capability has enabled the practical implementation of complex signal processing in the digital domain.

With the ability to cost-effectively implement digital signal processing circuitry, designers have begun to reduce the precision and complexity of conventional integrated analog filter circuitry by creating analog circuits whose outputs are digitized and forwarded to the digital domain in which various complex processing and filtering operations may be performed. Such arrangements are sometimes referred to as mixed-signal integrated circuits.

One area of application for such mixed-signal arrangements is in implementing a complete radio receiver, or at least large portions of a radio receiver, in an integrated circuit. In some radio receiver architectures an incoming RF signal is mixed down to a lower intermediate frequency which is then digitized for further processing in the digital domain. In some instances, control information may be returned to the analog domain from the digital domain.

What is needed are methods and apparatus for converting analog signals to digital signals in a radio receiver channel that are compatible with cost-effective implementations of substantial digital signal processing resources, while preferably moving quantization noise from the analog to digital conversion process out of the frequency band-of-interest, and removing by digital filtering.

SUMMARY OF THE INVENTION

Briefly, a radio receiver channel includes an analog front end and a digital signal processing section coupled together by an ADC having a delta-sigma modulator coupled to a first digital decimation filter, which is coupled to second digital decimation filter, wherein the first decimation filter includes a source of finite impulse response coefficients coupled so as to provide a plurality of coefficients to a barrel shifter, the barrel shifter adapted to shuffle the coefficients and to provide the plurality of shuffled coefficients to a corresponding plurality of computational resources. Each of the plurality of computational resources has a multi-bit output that is coupled to a multiplexer, which operates to select one of the plurality of multi-bit computational resource outputs as the output of the first digital decimation filter.

In a further aspect of the present invention, the delta-sigma ADC architecture features a multiple integrator loop filter, a multi-bit quantizer, dual DAC feedback loops, and dynamic element matching before at least one of the DACs.

BRIEF DESCRIPTION OF THE DRAWINGS

FIG. 1 is a schematic block diagram of a conventional analog front-end radio receiver channel implementation.

FIG. 2 is a high-level schematic block diagram of a radio receiver architecture that includes a bandpass ΔΣ ADC converter in accordance with the present invention.

FIG. 17 shows the timing relationship of various signal to illustrate the dependence to the latency of the third stage filter on enable time.

FIG. 18 is a timing diagram illustrating the enable time at a fixed phase of the 4 MHz clock signal.

DETAILED DESCRIPTION

Figure 3:
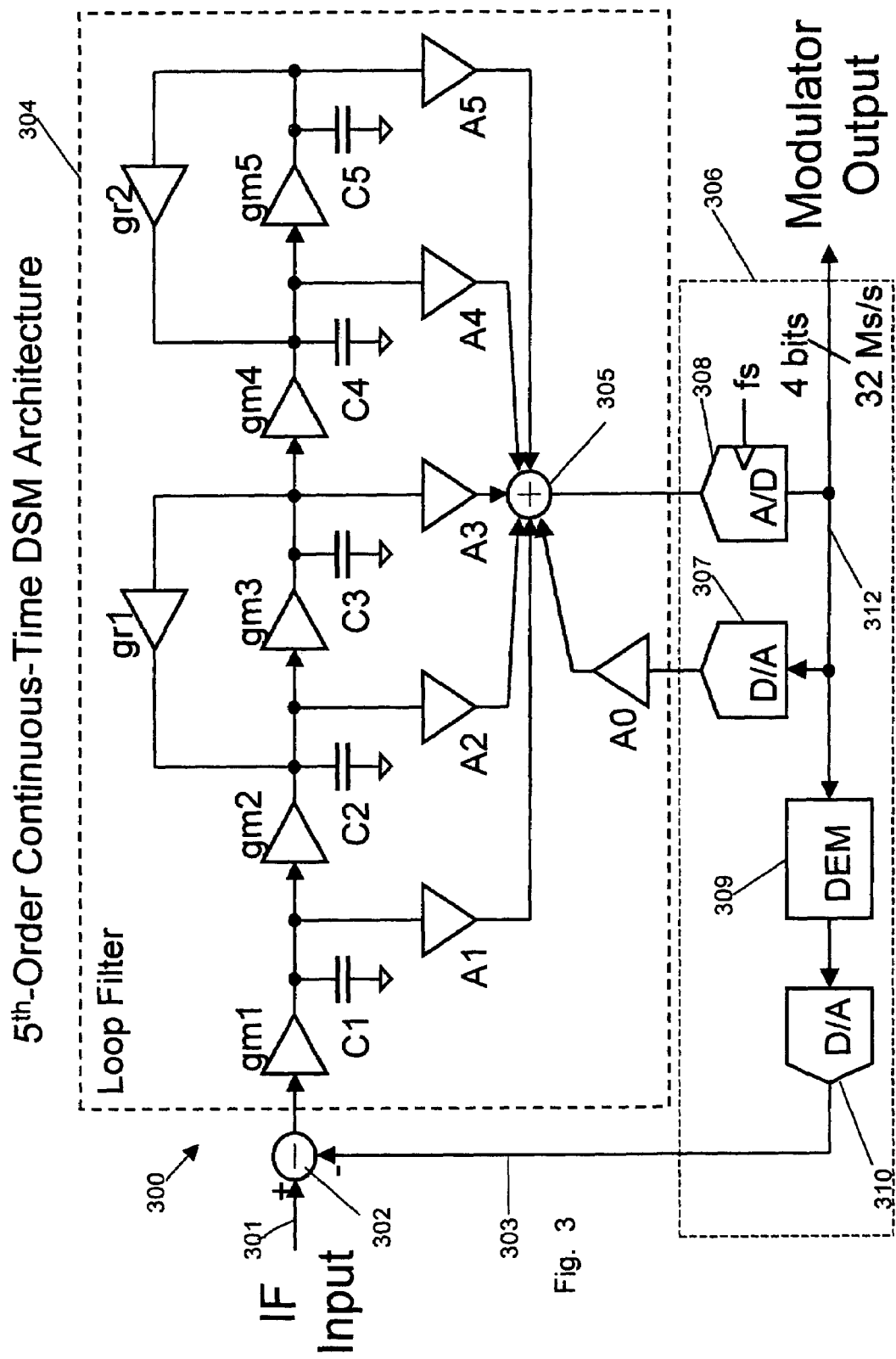
FIG. 3 is a schematic block diagram of the circuits of a bandpass ΔΣ modulator suitable for use in embodiments of the present invention.

Generally, a bandpass delta-sigma analog-to-digital converter suitable for use in a radio receive channel includes a bandpass delta-sigma modulator that receives an analog IF signal and produces a digital signal that is provided to a first decimation filter. The first decimation filter in accordance with the present invention includes a source of FIR coefficients, a barrel shifter that receives and shuffles a plurality of FIR coefficients, and a plurality of computational blocks, each computational block adapted to receive the output of the bandpass delta-sigma modulator, and further adapted to receive one of the plurality of FIR coefficients from the barrel shifter. Each of the plurality of computational resources is adapted to multiply the coefficient it receives with the bandpass delta-sigma modulator digital output signal. Each of the plurality of computational resources has an output that is coupled to a multiplexer, which operates to provide a selected one of the computational resource outputs as the output of the first decimation filter. The output of the first decimation filter may be provided as an input to a second decimation filter.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Referring to FIG. 1, a conventional analog front-end radio receiver channel implementation is shown. For the purpose of simplicity, only one channel is illustrated, although those skilled in the art will appreciate the fact that there are typically two channels, i.e., the in-phase and quadrature (referred to as I and Q) in such an arrangement. In the conventional approach, stringent IF filtering and programmable gain amplifiers are required in order to reject adjacent channel interference and to reduce the dynamic range of the signal to fit within the limited signal-to-noise ratio (SNR) capabilities of a low-resolution ADC (e.g., 6-bits at 8 Ms/s). A 6-bit flash ADC is relatively easy to construct at this speed, but there are several difficult circuit design tasks, including a high-order IF filter. Such an on-chip high-order IF filter is generally difficult to design and implement. A tuning scheme is required to counter the expected component variations from the semiconductor manufacturing process. However, even with a robust tuning scheme, there are tolerances due to on-chip matching capabilities which require certain margins to be built into the IF filter specifications in addition to those which result from the interface rejection requirements.

Common techniques for tuning on-chip filters involve nonlinear elements that make it challenging to meet high-linearity and wide-dynamic range performance requirements. Limitations in component tolerances, matching, and finite-circuit effects limit the ability to construct sharp filters with analog techniques in an integrated circuit. For applications that demand sharp IF filtering, off-chip SAW filters, or off-chip tunable LC circuits, which are tuned during manufacturing, have typically been used. For integrated CMOS radios, highly accurate switched-capacitor filters can be used if power consumption is not an issue. For low-power CMOS radio applications, the IF filtering remains a substantial design task that pushes on all corners of linearity, dynamic range, and power.

A Programmable Gain Amplifier (PGA) also represents a difficult design and implementation task. A PGA requires automatic gain control (AGC). An AGC circuit suitable for such an application must be capable of rapidly and precisely adapting to changing signal conditions in order to maximize the SNR of the digitized signal SNR without saturating the ADC, because of the very limited dynamic range of the flash ADC described above.

On-chip analog filter circuits also present a difficult design and implementation task. Even under the best conditions, analog filters have fundamental limitations regarding how narrow to make the selective IF filtering without excessive magnitude and phase distortion. Consequently, it is desirable to move some of the IF filtering tasks into the digital signal processing circuitry coupled to the outputs of the ADC. However, the ADC sampling rate and dynamic range must be increased to accommodate and digitize the additional interference that is passed on to the digital filters. Flash ADC circuitry increases very rapidly in size, power, and complexity when its resolution is increased beyond 6-bits.

Increasing the resolution and sampling frequency of the ADC relaxes the requirements for IF filtering, PGA, and AGC circuits; and allows more of the IF filtering, PGA and AGC functions to be done in the digital domain. Given an opportunity to defer the IF filtering and PGA to the digital domain, there are a number of considerations and trade-offs with regard to whether to choose analog or digital filtering. For example, it is possible to construct digital filters that have signal processing characteristics that are superior to those that can be achieved in the analog domain, however such advantages may come at the expense of increased chip area and increased power consumption. Notwithstanding the costs in terms of area and power, the improved signal processing results in better IF filters, which in turn results in better radio performance. Additionally, as IC geometries get smaller with advances in semiconductor manufacturing technology, the cost and power consumption of digital filters decrease accordingly, whereas analog filters do not scale with process geometry. In fact, because decreases in IC geometries generally require a corresponding decrease in power supply voltages, it is increasingly difficult to meet the same SNR performance in analog circuits. Also, in terms of the design resources and/or engineering effort required, it is easier to design digital filters than analog filters especially when the filer specifications push the limits of linearity, dynamic range, and power. It will be appreciated that the ability to move the IF filter and PGA into the digital domain depends on the ability to construct high-resolution, high-sampling-rate ADCs, which is one of the contributions of bandpass $\Delta\Sigma$ A/D converters in accordance with the present invention.

FIG. 2 shows a high-level schematic block diagram of a radio architecture 200, that includes a bandpass $\Delta\Sigma$ ADC converter in accordance with the present invention. More particularly, an antenna 202 is coupled to a low noise amplifier 204. An output of low noise amplifier 204 is coupled to mixer 206, and mixer 206 is further coupled to receive a signal from local oscillator 208. An output of mixer 208 is coupled to IF filtering circuitry 210. An output of IF filtering circuitry 210 is coupled to programmable gain amplifier 212. PGA 212 is coupled to a delta-sigma modulator 214, which has a multi-bit output that is coupled to a first stage decimation filter 216. First stage decimation filter 216 is further coupled to a second stage digital decimation filter 218, which in turn provides an output that is typically coupled to further digital signal processing circuitry (not shown in FIG. 2).

The ADC includes of a $\Delta\Sigma$ modulator that digitizes with very low resolution (for example, as low as 1-bit) but at a much higher frequency than the Nyquist sampling frequency. Although the such coarse quantization by the $\Delta\Sigma$ modulator produces large errors, the $\Delta\Sigma$ modulator in accordance with the present invention randomizes the quantization error (i.e., turns it into a random noise) and shapes the quantization noise away from the frequency band-of-interest. A substantial amount of oversampling (defined as the ratio of modulator sampling frequency divided by twice the signal bandwidth) is required in order to have the frequency regions to place the undesired quantization noise. The $\Delta\Sigma$ modulator is followed by a digital decimation filter that removes the out-of-band quantization noise as well as any out-of-band interference components. With out-of-band frequency components removed, it is safe to reduce the output data rate without aliasing out-of-band signals into the band-of-interest. It is often advantageous to lower the output data rate in order to minimize the computation requirements on the subsequent digital signal processing. With the bulk of the quantization noise digitally removed, the ΔΣ ADC output is a very high resolution signal that is generally limited only by the thermal noise of the modulator's analog circuitry. In the illustrative embodiment of FIG. 2, the ΔΣ modulator samples at 32 MHz and is followed by two stages of decimation filters.

Still referring to FIG. 2, it is generally desirable to use the first stage digital decimation filter 216 to perform much of the rate reduction because it can take advantage of the wide transition bands and very short word widths at the output of the ΔΣ modulator, even though it must process the signal at a very high data rate. Once the data rate is reduced, the second stage digital decimation filter 218 can provide very sharp transition bands with a reasonable amount of computation. In the illustrative embodiment of FIG. 2, the first stage decimation filter 216 brings the data rate down to 8 MHz and the second stage allows further decimation to the Nyquist sampling rate if desired.

One advantage of using a high resolution ΔΣ ADC in the radio receiver application is that the large SNR of the ADC allows substantial reduction of the analog IF filter and amplifier circuitries. The wider ADC dynamic range also relaxes the analog AGC requirements. However, in typical embodiments, the IF filter and AGC functions are performed in the digital domain where they can be implemented with digital precision.

The bandpass ΔΣ ADC for the radio receiver channel application in accordance with the present invention, and bandpass ΔΣ ADC circuits that have been used in audio applications have some similarities in their characteristics as well as difference in characteristics and implementations. For example, both involve the acquisition of a band limited signal with a well defined band-of-interest. However, today's digital radio applications generally need bands of more than 1 MHz, which is much wider than the 20 kHz bands found in audio applications. Also both applications require high-resolution A/D conversion, but digital audio requires 16-bits and higher, while radio requires 80 dB and higher SNR. Prior to the use of ΔΣ ADCs, audio converters had used gain-ranging architectures much like the AGC function in radio. And just as in audio, there are substantial advantages in minimizing or eliminating the AGC function. Both involve application specific filtering, e.g., IF filtering in radio versus anti-alias filtering in audio. Both applications demand an ADC architecture that is compatible with low-cost, high-volume, digital CMOS manufacturing technologies. ΔΣ ADC in audio was driven by the increasing digital media formats and multimedia PCs, while modern wireless applications are driven by network and data communications. Both involve large amounts of digital signal processing in the applications. Traditional high resolution ADC architectures that require precision components, laser trimming, and specialized manufacturing are not compatible with the cost structure of system-on-chip (SOC) IC products with huge digital content.

These applications demand an ADC architecture that does not use specialized precision analog components, constructed in very fine-line semiconductor manufacturing technologies, and does not require special manufacturing flow. ΔΣ ADCs seek to minimize the analog circuits at the expense of additional digital circuitry. This tradeoff is advantageous in deep submicron semiconductor processes (e.g., CMOS) where the cost implementing digital circuitry tends to decrease rapidly as semiconductor manufacturing technologies advance over time.

In embodiments of the present invention, the purpose of the ΔΣ modulator is to digitize the analog input signal, while shaping the bulk of the quantization noise away from the band-of-interest where it can be removed by a digital filter. An illustrative ΔΣ modulator is shown in FIG. 3.

Referring to FIG. 3, a schematic block diagram of the circuits of a bandpass ΔΣ modulator 300 suitable for use in embodiments of the present invention is shown. An analog input signal 301, which is an IF signal in the radio receiver channel, is combined with a feedback signal 303 at 302 to produce a difference. The difference is an error signal that is processed by a loop filter 304. Loop filter 304 amplifies the error signal that is in the band-of-interest. The output of loop filter 304 is quantized and fed back as feedback signal 303 to be combined with input signal 301. It is noted that loop filter 304 must be designed so that the loop is stable. In stable closed loop operation, the high gain of loop filter 304 over the band-of-interest forces feedback signal 303 to closely track input signal 301 at the desired frequency band. However, the total amount of quantization noise is constant, and is determined by the resolution of a quantizer 306. Consequently, the quantization noise is forced to out-of-band frequencies. It will be appreciated that bandpass delta-sigma modulator 300 should be configured such that loop filter 304 provides a substantial shaping of the quantization noise while maintaining loop stability.

Still referring to FIG. 3, it can be seen that illustrative loop filter 304 is implemented with continuous-time, gm/C filter circuitry. Loop filter 304 is a fifth-order loop filter implementation. The two local feedbacks, gr1 and gr2, create resonance responses at frequencies within the passband thereby creating huge signal gains over the passband. Loop filter coefficients A1–A5 are designed to maintain loop stability. FIG. 3 also shows that quantizer 306 includes a flash ADC 308 having a 4-bit resolution coupled to a dynamic element matching block 309, which is coupled to a digital-to-analog converter (DAC) 310 having a 4-bit resolution. It will be appreciated that alternative embodiments of the present invention may include devices having different resolution, for example, an ADC that has a resolution other than 4-bits. The digital output of flash ADC 308 is referred to herein as modulator output 312.

Still referring to the illustrative embodiment shown in FIG. 3, it can be seen that there is a pathway between quantizer 306 and loop filter 304 which comprises digital output node 312 coupled to DAC 307 which is coupled in turn to summing circuit 305.

Those skilled in the art will appreciate that, although the illustrative delta-sigma modulator described herein includes continuous time gm/C filter circuitry, delta-sigma modulators may be implemented with discrete-time circuitry such as switched-capacitor filter circuitry or with R-C active filter structures. It will also be appreciated that the gm/C filter circuitry can be implemented using resistors to define the transconductance gm.

Several other features are worth noting in the illustrative bandpass delta-sigma modulator 300. Continuous-time active loop filters generally have advantages over discrete-time switched-capacitor filter circuitries in low power and high frequency operation. However, continuous-time active filter circuits are much more susceptible to manufacturing tolerances and will generally need to be tuned with additional circuitry. The loop filter circuitry is very much similar to what one would use in an integrated CMOS IF filter and these share similar circuit limitations. With some incremental complexity, the loop can be designed to have a bandpass filter response to signal as with any $5^{th}$-order analog filter. However, it is generally not desirable to provide a very strong analog filtering response because of concerns over tuning and component accuracies. Generally, the sharp filtering function is deferred the digital domain. DAC nonlinearity is not tolerated in the configuration. For multi-bit delta-sigma modulators, dynamic element matching (DEM) is commonly employed to scramble the DAC nonlinearity errors so that the bulk of the errors are shaped to out-of-band frequencies, and are removed in the decimation filter along with the out-of-band quantization noise.

Figure 4:
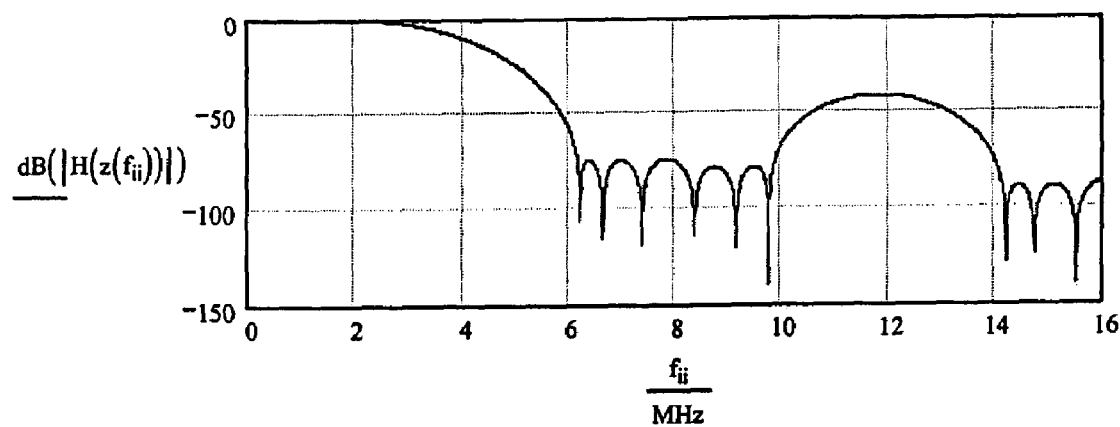
FIG. 4 shows the frequency response of a 21-tap finite impulse response (FIR) filter.

With respect to the first stage decimation filter, this filter can take advantage of the very short word width of the output of the bandpass delta-sigma modulator, and the wide transition band. FIG. 4 shows the frequency response of a 21-tap finite impulse response (FIR) filter with the characteristics shown in Table 1 below.

TABLE 1

| Passband | 1 MHz ± 850 kHz | <±0.04 dB ripple |
|---|---|---|
| Stopband 1 | 7 MHz ± 850 kHz | >75 dB attn |
| Stopband 2 | 9 MHz ± 850 kHz | >79 dB attn |
| Stopband 3 | 15 MHz ± 850 kHz | >90 dB attn |

Referring to FIG. 4, the x-axis of is in MHz and the y-axis is in dB. The filter response is flat until above 2 MHz before rolling off to −75 dB at 6.150 MHz. The response is allowed to rise between 10 MHz and 14 MHz but in this illustrative embodiment this frequency region will be aliased to the region between 2 MHz and 6 MHz where it can be removed by the second stage decimation filter.

Figure 5:
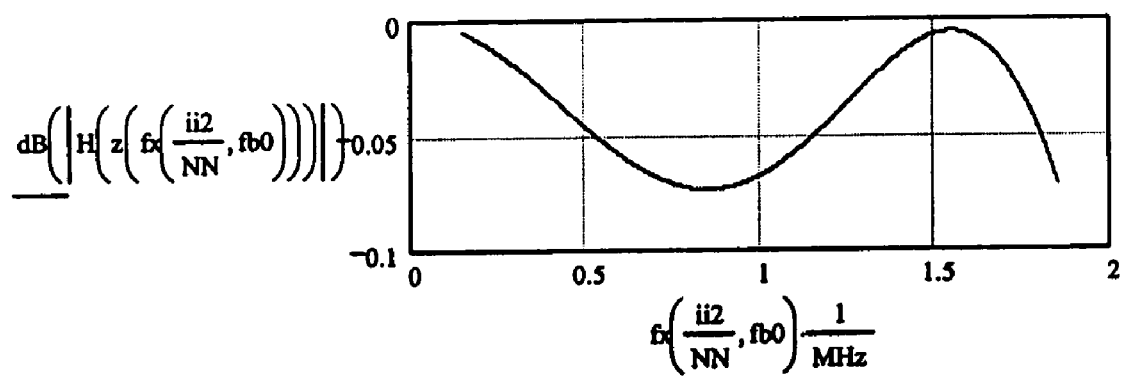
FIG. 5 shows a more detailed view of the passband response of FIG. 4.

FIG. 5 shows the passband response in detail. The x-axis is in MHz and the y-axis is in dB. It shows an equal-ripple response to within ±0.04 dB of a flat response. It is noted that with any symmetric FIR filters, the phase response is linear with a constant group delay equal half the FIR length (0.328 us in this case).

Figure 6:
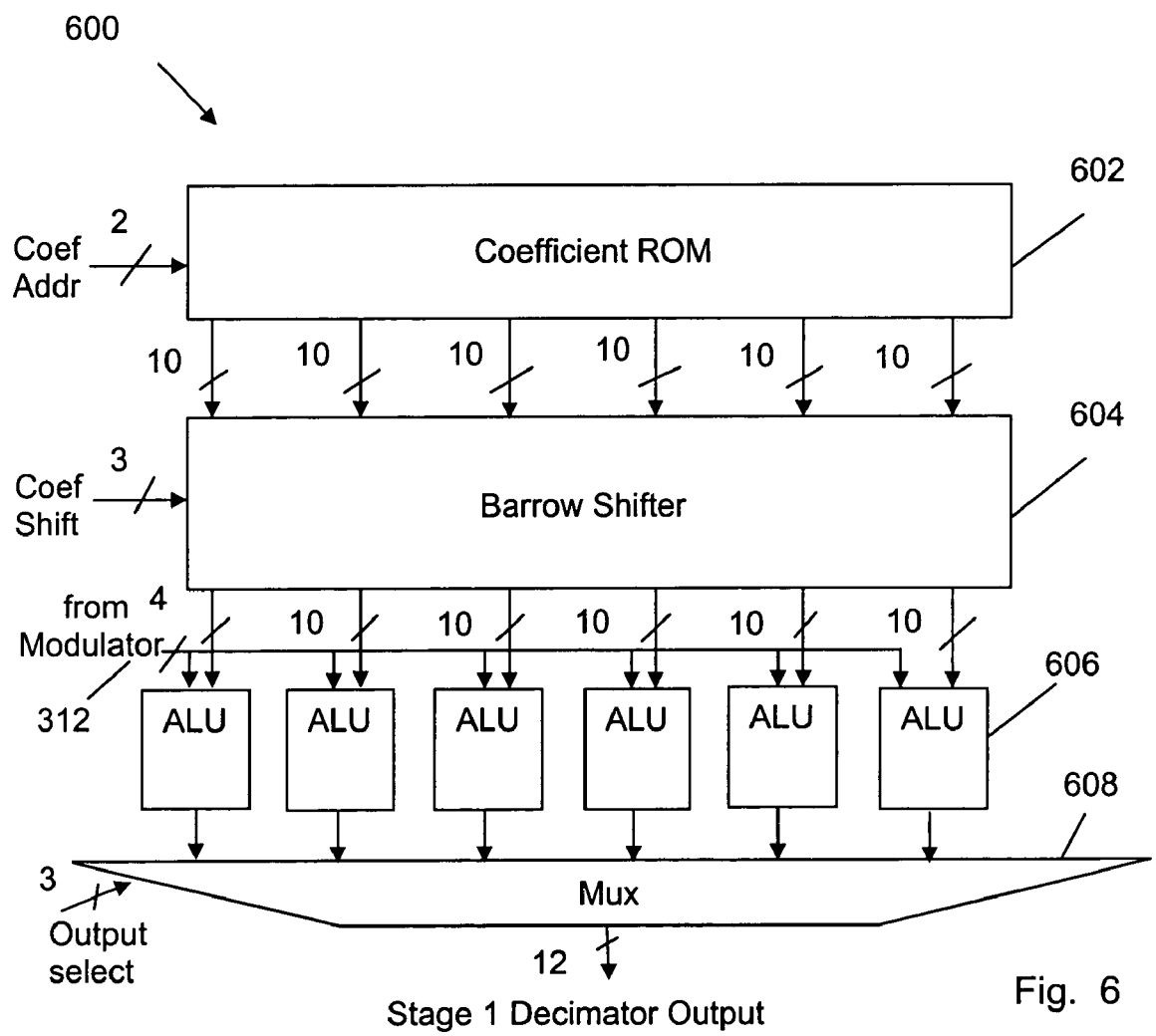
FIG. 6 is a schematic block diagram of an illustrative hardware datapath for implementing a first stage decimation filter in accordance with the present invention.

Referring to FIG. 6, an illustrative embodiment of the first stage decimation filter, is shown. More particularly, FIG. 6 shows a hardware datapath for implementing such an illustrative first stage decimation filter.

In the illustrative first stage decimation filter 600 of FIG. 6, the FIR coefficients are stored in a 4×60 Read-Only-Memory 602 (ROM). FIR coefficient ROM 602 may be implemented in any suitable manner, including but not limited to implementation by combinational logic gates. It will be appreciated that this coefficient storage may be referred to more generally as a source of FIR coefficients, and that such a source may be implemented in a variety of ways, including but not limited to volatile storage, and non-volatile storage. In this context, the terms storage and memory may be used interchangeably. Volatile storage refers to any circuits or structures in which data is stored and maintained while power is applied, but which lose data integrity when power is removed. Static RAM (SRAM) and Dynamic RAM (DRAM) are examples of volatile storage. Non-volatile storage refers to any circuits or structures in which data stored and which maintain data integrity when power is removed. ROMs and Flash memories are examples of non-volatile storage. Fuse-based memory circuits and anti-fuse-based memory circuits may also be used for storing the coefficients, and are generally considered to be writable and non-volatile types of memory circuits. It is further noted that the source of FIR coefficients may be a writable memory. SRAM, DRAM, and Flash are examples of writeable memories. By making the source of FIR coefficients a writeable memory, the coefficients may be changed subsequent to the fabrication of an integrated circuit in which an embodiment of the present invention is formed.

In operation, FIR coefficient ROM 602 is read at least once during every 32 MHz cycle, cycling though each of the four addresses. A barrel shifter 604 is used to shuffle the filter coefficients to six ALU blocks 606. As can be seen in FIG. 6, each ALU block 606 receives the digitized output 312 of bandpass delta-sigma modulator 300, and one of the plurality of filter coefficients that are output from barrel shifter 604. The output of each of the ALU blocks 606 is coupled to a multiplexer 608. During each 8 MHz cycle, one of the ALU outputs is selected by the multiplexer 608 and provided as the output of first stage decimation filter 600.

Figure 7:
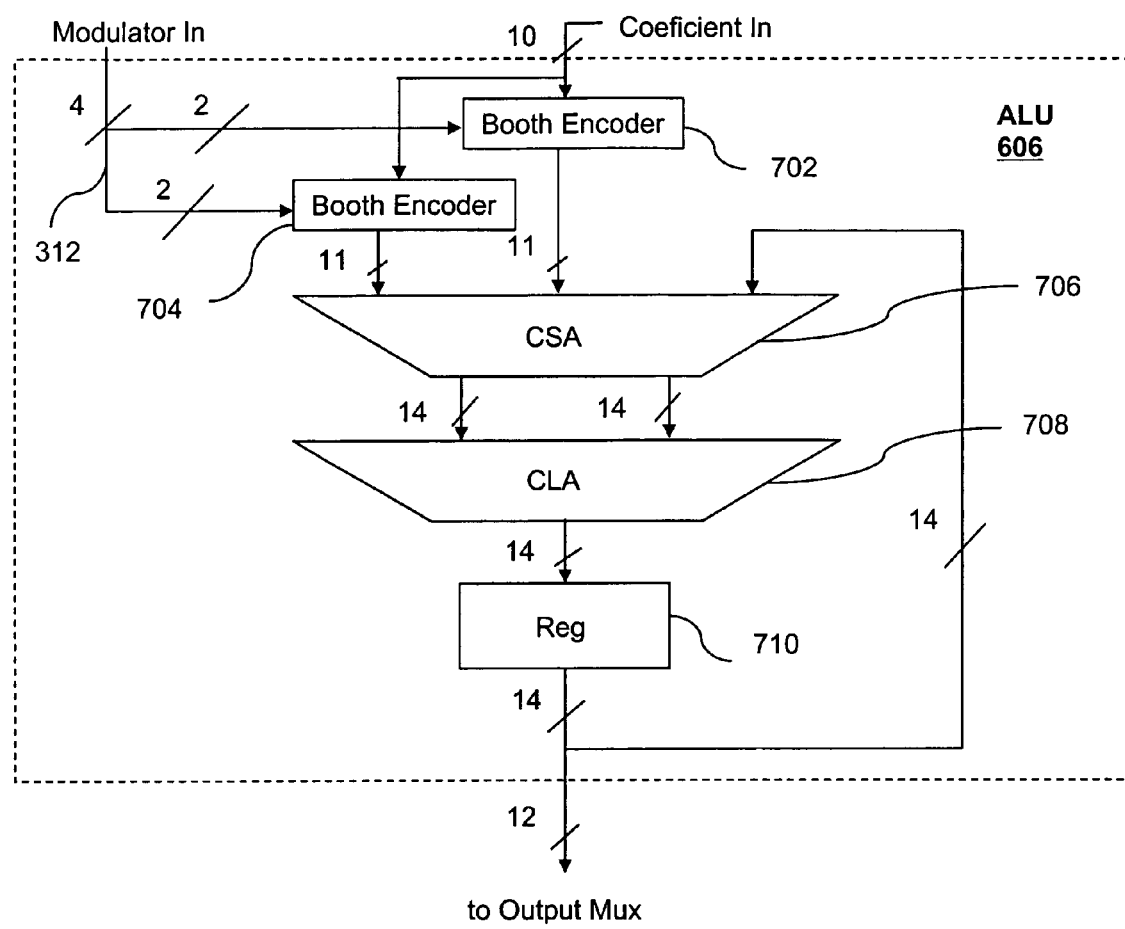
FIG. 7 is a detailed schematic block diagram of the ALU of FIG. 6.

Referring to FIG. 7, a detailed schematic block diagram of ALU 606 is shown. ALU 606 includes a first Booth multiply encoder 702 and a second Booth multiply encoder 704. Each of first and second Booth multiply encoders 702, 704 are coupled to receive the FIR coefficient received from barrel shifter 604, while first Booth multiply encoder 702 is further coupled to receive a first portion of the bandpass delta-sigma modulator digital output and the second Booth multiply encoder 704 is further coupled to receive a second portion of the bandpass delta-sigma modulator digital output. A carry-save adder 706 is coupled to receive the outputs of each of first and second Booth multiply encoders 702, 704. Carry-save adder 706 is further coupled to provide its output to a carry-lookahead adder 708. The output of carry-lookahead adder 708 is coupled to register 710, which in turn provides the output of ALU 606.

In operation, during each 32 MHz cycle, the FIR coefficient read from ROM 602 and shuffled by barrel shifter 604 is multiplied by the 4-bit modulator output signal 312 using Booth Multiply Encoders 702, 704 and is accumulated by carry-save adder 706 followed by carry-lookahead adder 708. The accumulation is done with wider word width than is actually needed at the output in order to suppress numerical computation error effects.

The second stage decimation filter is generally application specific and in various embodiments, the second stage decimation filter can be merged into the application specific filtering. The second stage decimation filter can be described in general terms in that it must remove adjacent channel interference and out-of-band quantization noise. With out-of-band components removed, the output can be safely decimated if desired. Also, digital AGC (witch resembles fix to floating-point data format conversion) can be applied to minimize the word width into the digital demodulator.

Figure 8:
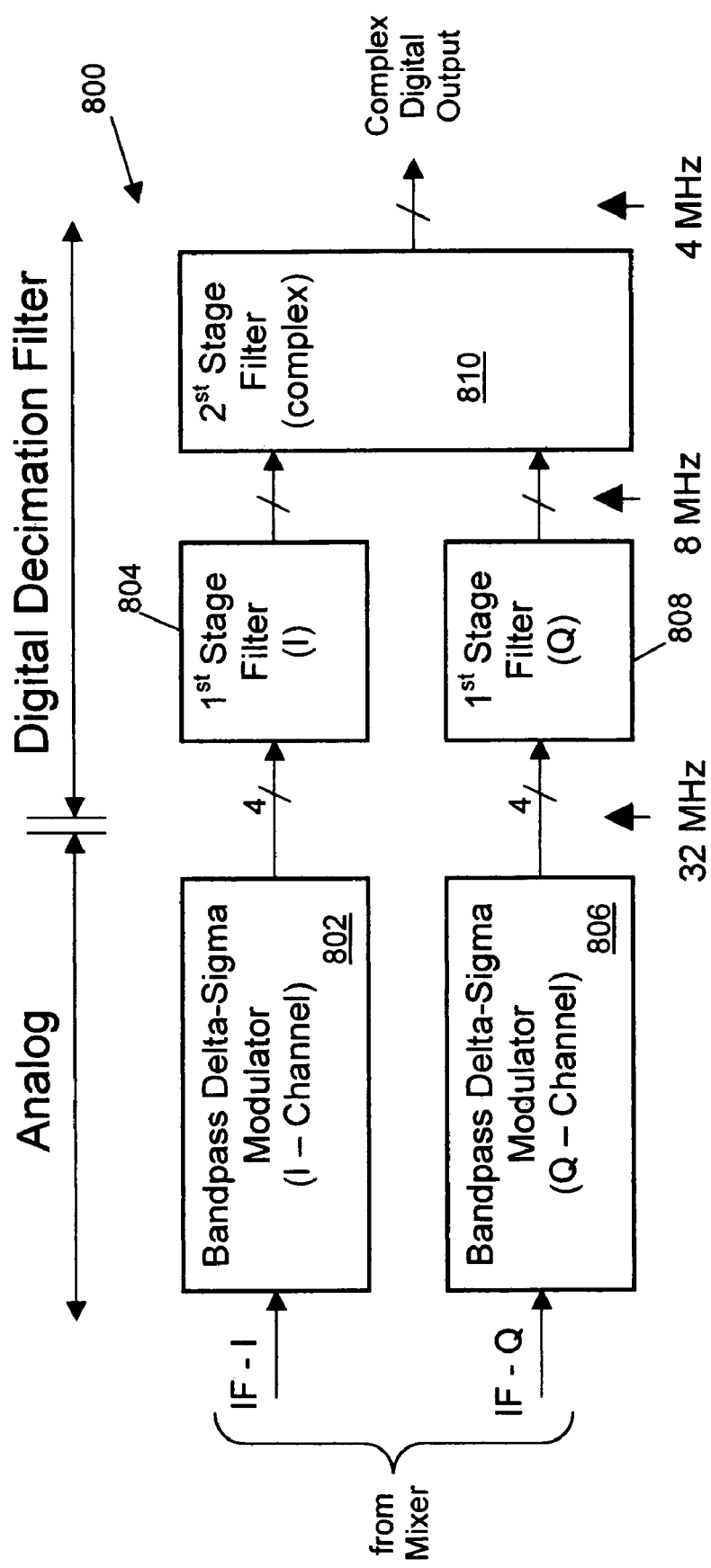
FIG. 8 is a high-level block diagram of a portion of a radio receive channel showing both I and Q channels each having a bandpass delta sigma modulator ADC coupled to a respective first stage decimation filter, and each of the first stage decimation filters coupled to a second stage decimation filter that is arranged to provide a complex digital output.
Figure 9:
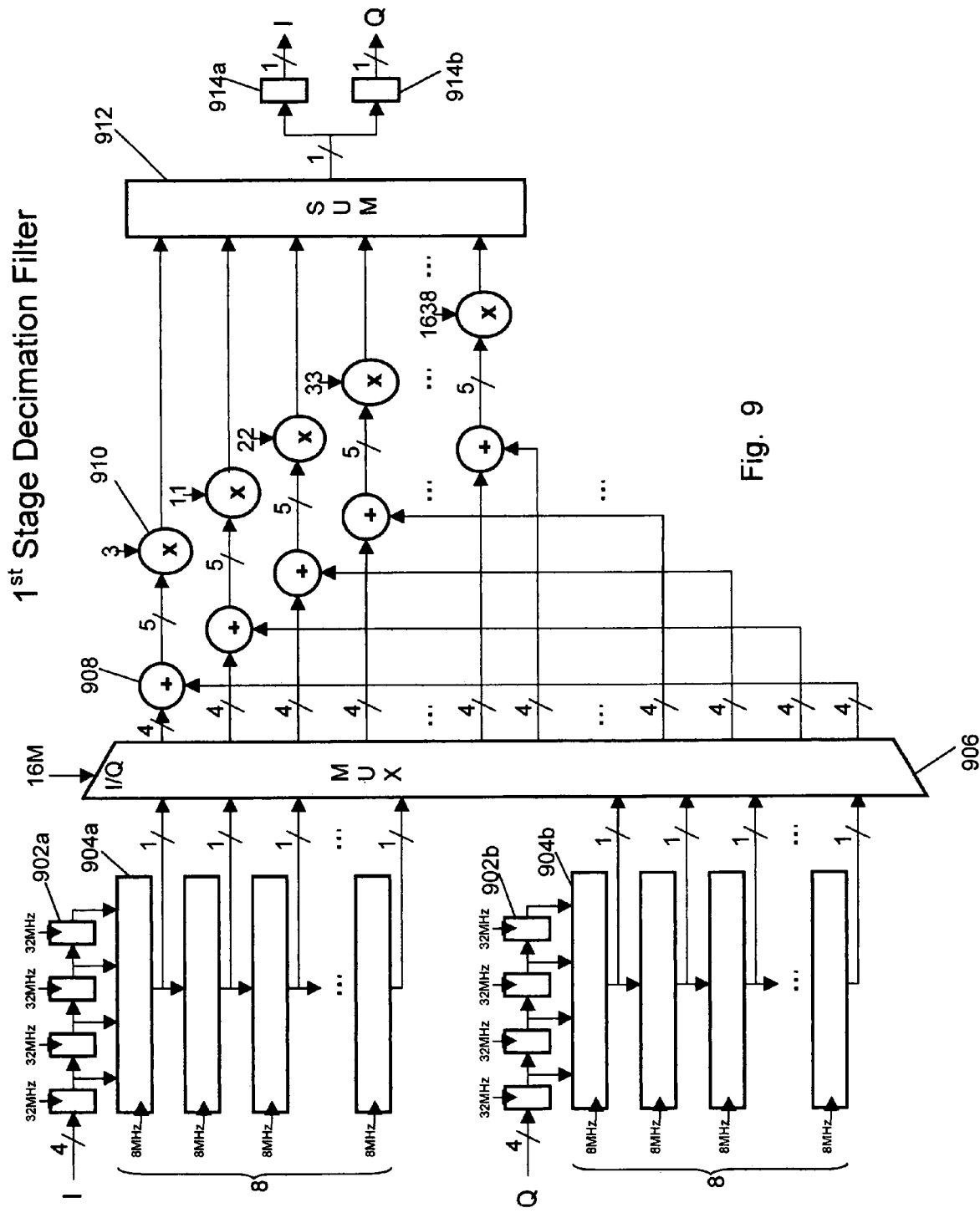
FIG. 9 is a detailed schematic block diagram of illustrative I-channel and Q-channel first stage decimation filters in accordance with the present invention.
Figure 10:
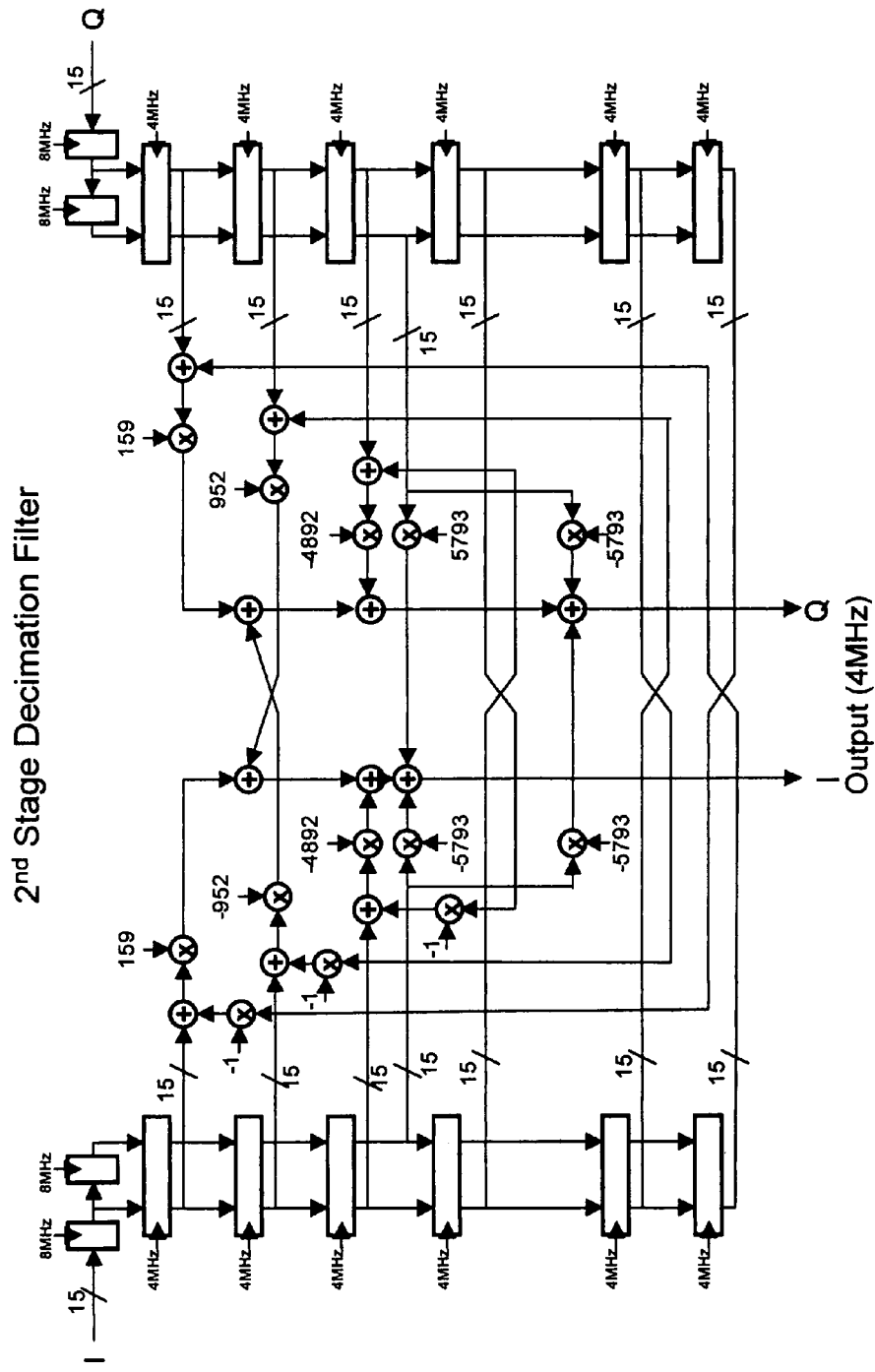
FIG. 10 is a detailed schematic block diagram of an illustrative second stage decimation filter, in accordance with the present invention.

Referring to FIGS. 8–10, an illustrative portion of a radio receive channel in accordance with the present invention is shown. More particularly, details of illustrative embodiments of the decimation filters are shown, and their structure and operation are described.

FIG. 8 is a high-level block diagram of a portion of a radio receive channel 800 showing both I and Q (i.e., in-phase and quadrature) channels each having a bandpass delta sigma modulator ADC coupled to a respective first stage decimation filter, and each of the first stage decimation filters coupled to a second stage decimation filter that is arranged to provide a complex digital output. More particularly, a bandpass ΔΣ modulator 802, having an analog input terminal and a multi-bit digital output, is disposed in the I-channel. The multi-bit digital output of bandpass ΔΣ modulator 802 is coupled to an I-channel first stage decimation filter 804 which, in the illustrative embodiment of FIG. 8, is adapted to receive the multi-bit output at a first frequency and to produce a multi-bit output at a second, lower, frequency. The Q-channel is similarly arranged with a bandpass ΔΣ modulator 806 having an analog input terminal and a multi-bit digital output. The multi-bit digital output of bandpass ΔΣ modulator 806 is coupled to a Q-channel first stage decimation filter 808 which is also adapted to receive the multi-bit output of bandpass ΔΣ modulator 806 at a first frequency and to produce a multi-bit output at a second, lower, frequency. The digital outputs of both I-channel first stage decimation filter 804 and Q-channel first stage decimation filter 808 are coupled to a second stage decimation filter 810 that is adapted to produce a complex digital output.

In operation, the analog input to the bandpass delta-sigma modulators comes from the mixers of the radio receive channel which, with input from local oscillators, mix an incoming RF signal down to the IF, and also produce the in-phase and quadrature analog signals. In this illustrative embodiment, bandpass delta-sigma modulators 802, 806 digitize the IF I and Q signals respectively into two 4-bit digital signals with word rates of 32 MHz. The I-channel and Q-channel first stage decimation filters 804, 808 operate to reduce the data rate to 8 MHz. Second stage decimation filter 810 further reduces the data rate down to 4 MHz. Second stage decimation filter 810 uses complex coefficients (i.e., having real and imaginary numbers) to process both the I and Q inputs concurrently, and to produce a complex digital output.

FIG. 9 is a detailed schematic block diagram of illustrative an I-channel and Q-channel first stage decimation filter implementation 900 in accordance with the present invention. It can be seen in FIG. 9, that the 4-bit digital outputs of the I-channel and Q-channel bandpass delta-sigma modulators 802, 806 are presented as inputs to first stage decimation filter circuitry 900. First stage decimation filter circuitry 900 has circuitry for receiving the I-channel digitized data that includes four 4-bit wide registers 902a coupled in series, and further arranged to provide their outputs in parallel to a first of eight 16-bit wide registers 904a that are coupled to each other; and further has circuitry for receiving the Q-channel digitized data that includes four 4-bit wide registers 902b coupled in series, and further arranged to provide their outputs in parallel to a first of eight 16-bit wide registers 904b that are also coupled to each other. Each of the eight 16-bit registers 902a provides its output to multiplexer 906, and each of the eight 16-bit registers 902b likewise provides its output to multiplexer 906. Multiplexer 906 is coupled to adders 908, which in turn are coupled to multipliers 910. Multipliers 910 each are coupled to receive filter coefficient data as the second input to the multiplication operation. Multipliers 910 are coupled to a summer 912, which in turn is coupled to I and Q output registers 914a and 914b.

In operation, as noted above, the I and Q inputs are provided by analog delta-sigma modulators 802, 806. The I and Q inputs are each 4-bits wide, and each arrive at a rate of 32 MHz. These 4-bit words from the delta-sigma modulators are collected at 32 MHz into groups of 4 words. These are then shifted down eight 16-bit registers at a rate of 8 MHz. A large multiplexer 906, selects between the I and Q channels alternately at a rate of 16 MHz as shown in FIG. 9. The output of multiplexer 906 is applied to the filter computation. It is noted that since the filter coefficients are symmetric, the input data is summed along the line of symmetry before multiplying with the filter coefficients thus providing an efficient implementation. The outputs of multipliers 910 are summed together to form the final digital outputs which are then stored in the corresponding I and Q output registers 914a and 914b.

FIG. 10 is a detailed schematic block diagram of an illustrative second stage decimation filter, in accordance with the present invention. In operation, the inputs to the second stage decimation filter are first collected by delay registers. The complex filter computation is then performed, which utilizes adders and multipliers operating at a 4 MHz data rate to produce the I and Q outputs.

Referring to FIGS. 11–18, another illustrative embodiment of the present invention is described in which the bandpass delta-sigma modulator outputs (i.e., the digitized versions of the IF I and Q signals) are coupled to a decimation filter block that includes dynamic scaling.

In this illustrative embodiment, the decimation filter is to: downsample the data supplied by the bandpass delta-sigma modulator; filter out interference such that this interference does not fall back into the channel due to downsampling; attenuate the out-of-band interference sufficiently so that is does not saturate a dynamically scaled output; and scale the data sample so as to keep the magnitude of the signal at a substantially constant level. In some embodiments, the decimation filter block is used to correct for I and Q phase and amplitude imbalance.

As noted above, the ADC sampling rate of illustrative embodiments is 32 MHz. The decimation is performed in two parts. A first FIR filtering operation is used to down-convert the data from a 32 MHz rate to an 8 MHz rate, and a second, complex FIR filtering operation is used to further down-convert from 8 MHz to 4 MHz. The output of the decimation filter may have a very large dynamic range, and correspondingly may have a large number of bits involved in the computations and in the output. To save on the area and power requirements for the filter, output values of the illustrative embodiment are dynamically scaled to a predetermined power level.

Figure 11:
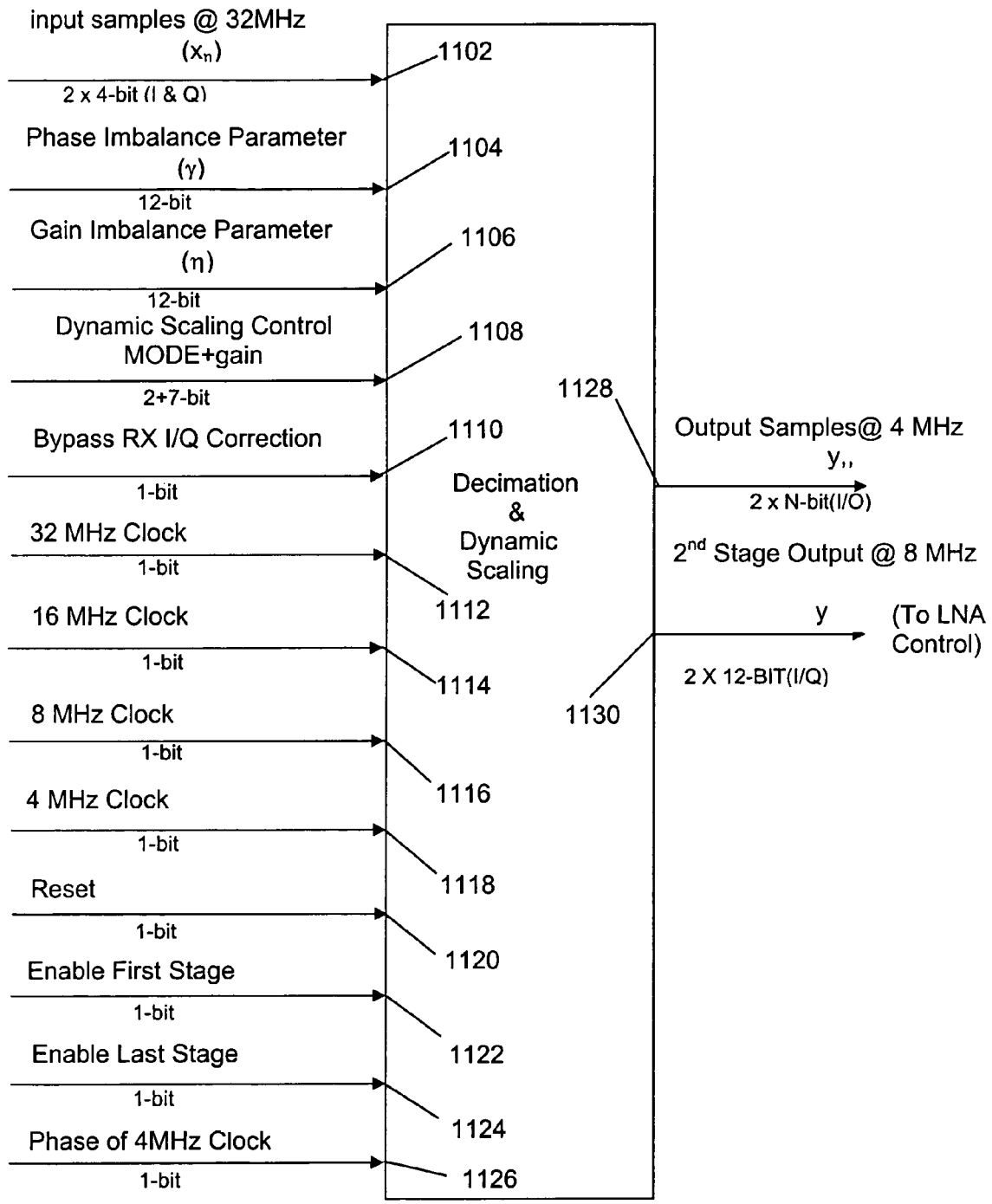
FIG. 11 is a high-level I/O schematic block diagram of a decimation and dynamic scaling block in accordance with the present invention.

FIG. 11 is a high-level schematic block diagram of a decimation and dynamic scaling block 1100 in accordance with the present invention. Block 1100 includes input terminals 1102 for receiving input samples at 32 MHz; input terminals 1104 for receiving a phase imbalance parameter; input terminals 1106 for receiving a gain imbalance parameter; input terminals 1108 for receiving dynamic scaling control information; an input terminal 1110 for receiving a control signal associated with the Receiver I and Q Correction function; an input terminal 1112 for receiving a 32 MHz clock signal; an input terminal 1114 for receiving a 16 MHz clock signal; an input terminal 1116 for receiving a 8 MHz clock signal; an input terminal 1118 for receiving a 4 MHz clock signal; an input terminal 1120 for receiving a reset signal; an input terminal 1122 for receiving an enable signal for the first stage decimation filter; an input terminal 1124 for receiving an enable signal for the last stage; and an input terminal 1126 for receiving a signal indicative of the phase of the 4 MHz clock. Block 1100 further includes output terminals 1128 for providing output samples at 4 MHz; and output terminals 1130 for providing output samples at 8 MHz.

With respect to the input samples at input terminals 1102, in this illustrative example there are two 4-bit ADC output samples provided at a 32 MHz rate form the complex (i.e., real and imaginary) value that is processed by block 1100. The phase imbalance parameter at input terminals 1104 is a 12-bit signed input parameter used for I and Q imbalance correction. The phase imbalance parameter at input terminals 1106 is also a 12-bit signed input parameter used for I and Q imbalance correction. The dynamic scaling control information received at input terminals 1108 includes nine bits, with a 2-bit mode input that controls the smoothing filter used in the dynamic scaling operation, and allows the freezing of the smoothing filter, disabling of the gear shift, etc.; and with a 7-bit dynamic scaling gain value that sets the scalar gain. In this illustrative embodiment, a logarithmic scale is used, which has a range of 80 dB and a step of between 0.5 and 1 dB. The control signal associated with the Receiver I and Q Correction function received at input terminal 1110 is used to control whether the correction function is performed or bypassed. The reset signal received at input terminal 1120 is used to reset all memory elements in block 1100 to a logical zero. It will be appreciated that the reset function may be used to put block 1100 into a known state regardless of whether the memory elements are set to logical zero, logical one, or a combination thereof. The enable signal for the first stage received at input terminal 1122 is used to enable/disable the first filter, and the enable signal for the last stage received at input terminal 1124 is used to enable/disable the I/Q imbalance correction, the third stage filter and the dynamic scaling. The signal received at input terminal 1126 is a 1-bit input that is indicative of the current phase of the 4 MHz clock signal with respect to the 8 MHz clock signal. This is used to enable the third stage filter at appropriate times so that the latency of the filter does not depend on when the input enable signal arrives.

Still referring to FIG. 11, the output samples at 1128 represent the decimated output and are provided at a 4 MHz rate. These are complex values and therefore contain two terms (real and imaginary). The output at 1130 includes two 12-bit values (I and Q), which are provided to a Low Noise Amplifier (LNA) control block.

In operation, there are number of functions that are performed by block 1100 in this illustrative embodiment. An input format conversion is performed, a first FIR filter operation is performed, a Receive I/Q Imbalance correction is optionally performed, second half-band filtering is performed, and dynamic scaling is performed.

As mentioned above, since the input data is in a 4-bit binary offset format an input format conversion is performed. The most significant bit (MSB) is inverted to convert the input to a signed number. Although this introduces a small DC change, it may be ignored for the purposes of this illustrative embodiment. In a further operation, the first FIR filter brings the data rate down from 32 MHz to 8 MHz. Let the filter coefficients be represented as $h_1(t)$, 0 t L−1, then the output of this filter is given as:

$$y_1(m) = \sum_{t=0}^{L_1-1} h_1(t) \cdot x(4m-t)$$

In a still further operation, a Receiver I/Q Imbalance Correction is performed. In this embodiment the output of the second stage decimation filter is passed through an I/Q Imbalance Correction block if the "bypass" input is not asserted. The samples after the I/Q correction has been performed are denoted herein as $y_2'$. The second stage half-band filter brings the data rate down from 8 MHz to 4 MHz. Let the filter coefficients be represented as $h_3(t)$, 0 t $L_3$−1, then the output of this filter is given as:

$$y_3(m) = \sum_{t=0}^{L_3-1} h_3(t) \cdot y_2'(2m-t)$$

With respect to the dynamic scaling operation, the output of the third half-band filter is dynamically scaled to a predetermined power level. This is done using a feed-forward loop, estimating the power of the filtered output, and finding an inversely proportional gain to scale the output.

Figure 12:
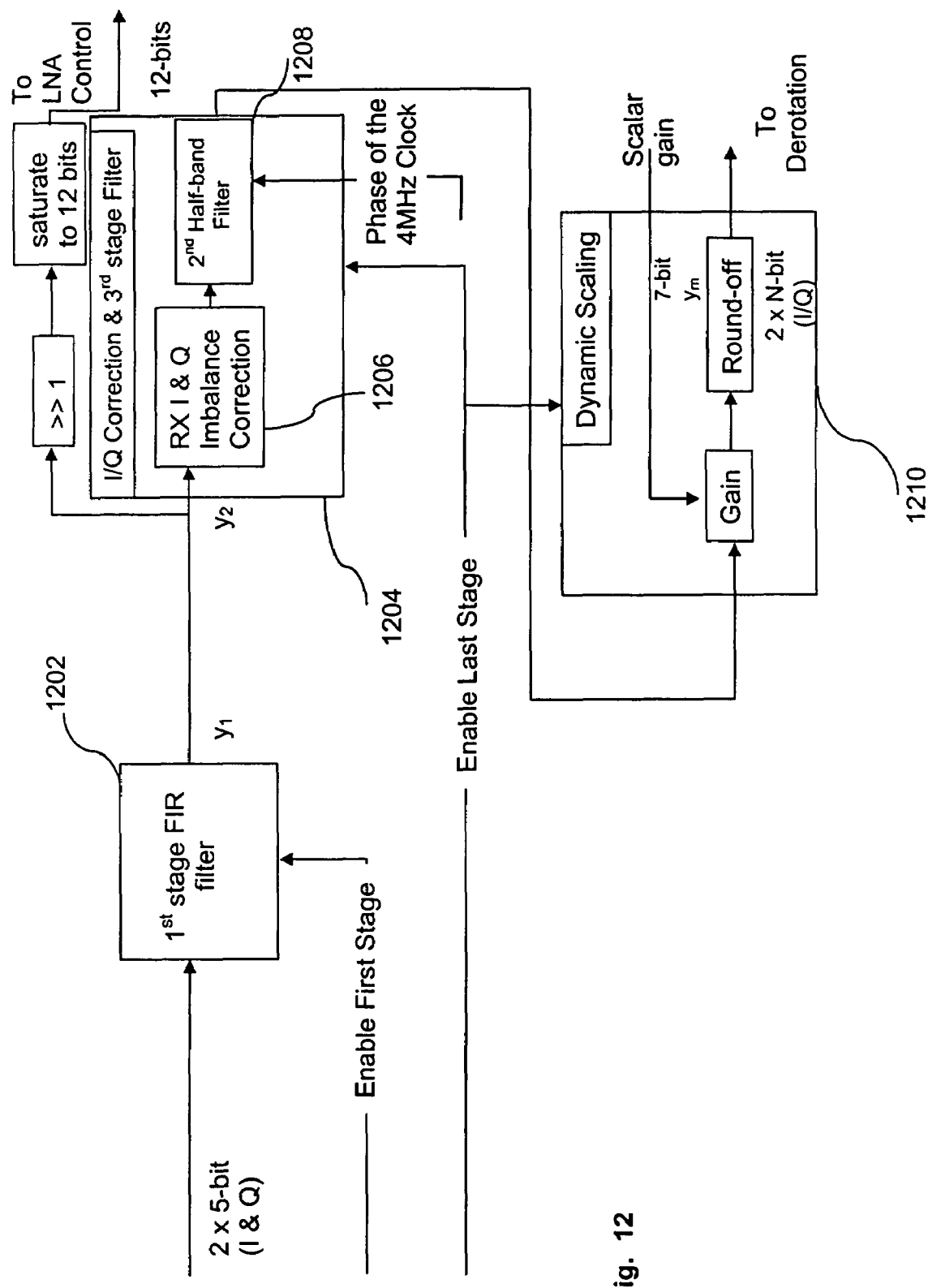
FIG. 12 is a schematic block diagram of an illustrative embodiment of the decimation filter and dynamic scaling circuitry.

Referring to FIG. 12, the decimation filters and dynamic scaling block of an illustrative embodiment suitable for performing the above-mentioned operations are shown. A first stage FIR filter 1202 is coupled to receive digitized I and Q data from a bandpass delta-sigma modulator (as described previously) and is further coupled to receive an enable signal. A first output of first stage FIR filter 1202 is coupled to an LNA control block, and a second output of filter 1202 is coupled to block 1204 which includes I/Q imbalance correction circuitry 1206 and second half-band filter 1208. Filter 1208 is further coupled to receive an enable signal and a signal indicative of the phase of the 4 MHz clock. The output of I/Q correction and filter block 1204 is coupled to dynamic scaling block 1210 as shown in FIG. 12.

The first stage FIR filter of the illustrative embodiment is a 30-tap filter, and the coefficients thereof are listed in Table 2.

TABLE 2

| Tap Number t | Tap Number t | Coefficient Value $h_2(t)$ | Number of Bits |
| --- | --- | --- | --- |
| 0 | 29 | 37 | 7 |
| 1 | 28 | 110 | 8 |
| 2 | 27 | 226 | 9 |
| 3 | 26 | 336 | 10 |
| 4 | 25 | 245 | 9 |
| 5 | 24 | −135 | 9 |
| 6 | 23 | −878 | 11 |
| 7 | 22 | −1782 | 12 |
| 8 | 21 | −2230 | 13 |
| 9 | 20 | −1637 | 12 |
| 10 | 19 | 615 | 11 |
| 11 | 18 | 4517 | 14 |
| 12 | 17 | 9284 | 15 |
| 13 | 16 | 13743 | 15 |
| 14 | 15 | 16384 | 16 |

Figure 13:
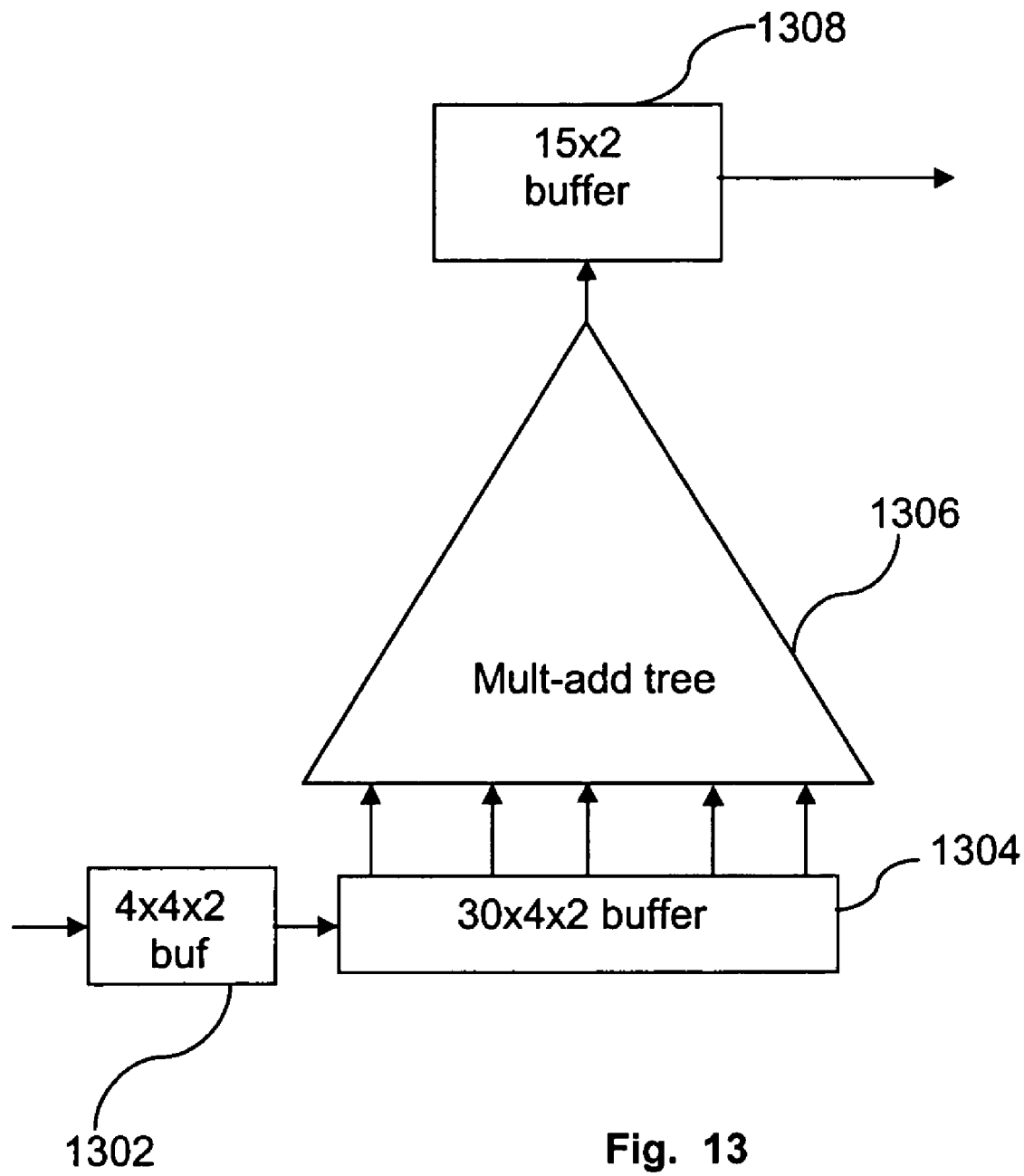
FIG. 13 is a schematic block diagram of a first decimation filter.

Referring to the block diagram of FIG. 13, a 4×4×2 buffer 1302 stores the newest four samples received from the bandpass delta-sigma modulator (ADC), and buffer 1302 is updated at a rate of 32 MHz. Buffer 1302 is coupled to a 30×4×2 buffer 1304, which stores the samples needed for the FIR filtering operation. Buffer 1304, which is updated at a rate of 8 MHz, is coupled to a multi-add tree 1306. Multi-add tree 1306 tries to compute the result of:

$$y_1(m) = \sum_{t=0}^{L_1-1} h_1(t) \cdot x(4m-t)$$

In view of the symmetry of the filter, the inputs are added pairwise before multiplying with the coefficients (see also FIG. 9). Fifteen multipliers are used to multiply the input sample with the coefficients. Since the input contains 5 bits, which is the result of the addition of two 4-bit numbers, each multiplier can be implemented as an adder. Fourteen adders then sum up all values into one result. In total, this requires 44 adders, 15 of which are 4-bit adders. In this illustrative embodiment, for every two clock cycles, one cycle is used to operate upon I data, and other is used to operate upon Q data.

With respect to the Receive I/Q imbalance correction, if the bypass input is not asserted, then the output of the second half-band filter is passed through the Receive I/Q Imbalance Correction block. However, in normal cases, this circuit is not needed. In typical cases, 1 dB of amplitude and 5 degrees of phase imbalance can be tolerated without requiring compensation.

With respect to the second half-band filter, the enable input may arrive at any 8 MHz clock edge. In order to ensure that the latency of the second half-band filter is substantially constant with respect to various frames of data, this block is always enabled at the same phase of the 4 MHz clock edge. For this reason, the phase of the 4 MHz clock is provided as an input. So this filter is enabled when the input enable signal is asserted and the phase of 4 MHz clock equals a constant value (which can either be zero or one, but once chosen should remain constant for all the frames being processed). More particularly, the latency of the filter depends of when the filter was enabled with respect to the edge of the 4 MHz clock as illustrated in FIG. 17. As can be seen in the figure, the latency in case 1 is more than in case 2. The problem arises because this is a downsampling block and computes only one of two possible phases of the output samples and holds each output sample for two sample periods. The output samples of this block are downsampled by the 4 MHz clock in the next block. The delay due to the downsampling depends on when the output sample was computed (i.e., when it became available for downsampling), which in turn depends on when the block was enabled. A solution is to delay the input enable signal internally such that the filter is always enabled at a fixed phase of the 4 MHz clock as is illustrated in FIG. 18.

The second half-band filter is an 11-tap FIR filter, and the coefficients are complex. However, all the coefficients, except for the central tap, are either purely real or purely imaginary and so do not require any extra computational complexity. The coefficients are listed in Table 3.

TABLE 3

| Tap Number t | Coefficient Values Real Re($h_3(t)$) | Imaginary Im($h_3(t)$) |
| --- | --- | --- |
| 0 | 159 | 0 |
| 1 | 0 | 0 |
| 2 | 0 | −952 |
| 3 | 0 | 0 |
| 4 | −4892 | 0 |
| 5 | −5793 | −5793 |
| 6 | 0 | −4892 |
| 7 | 0 | 0 |
| 8 | −952 | 0 |
| 9 | 0 | 0 |
| 10 | 0 | 159 |

The implementation of the second half-band filter is similar to that of the first stage filter in this illustrative embodiment. One difference is that the multiplier is more complex, although there are only four such multipliers in the second half-band filter.

Figure 14:
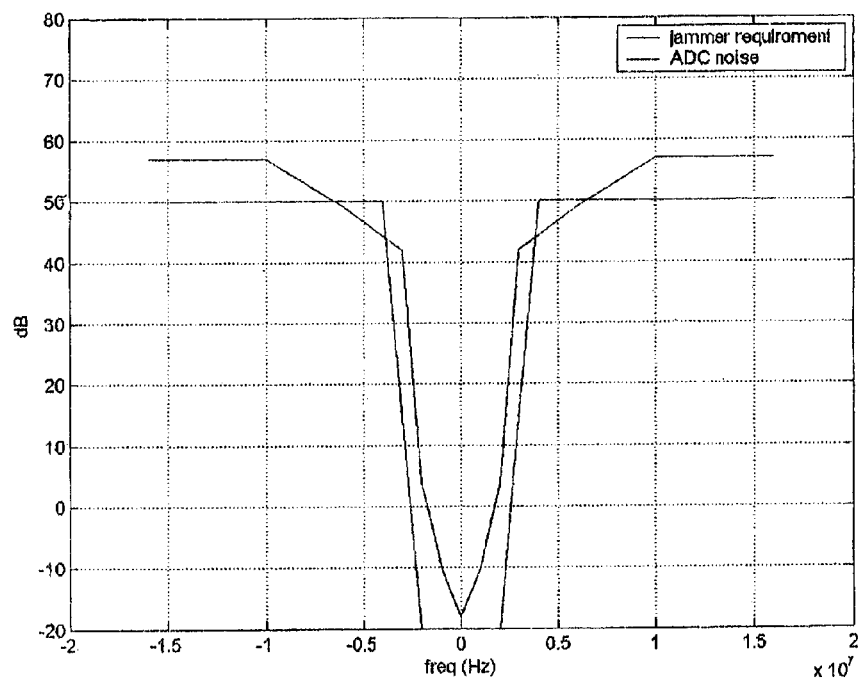
FIG. 14 is a plot of dB versus frequency.

As noted above, the decimation filter block functions to reduce the rounding noise from the bandpass delta-sigma modulator (ADC) in the alias band to a level less than that from in-band; and also functions to reduce to the out-of-band interference. The interference after decimation filter processing is not more than 15 dB above the signal, and so will not cause saturation in the dynamic scaling output. After the receiver filter, the interference should be more than 18 dB below the signal. Assuming the signal is at 0 dB and the in-band ADC noise is 20 dB below the signal, then the delta-sigma ADC noise spectrum and noise requirement are shown in FIG. 14.

Figure 15:
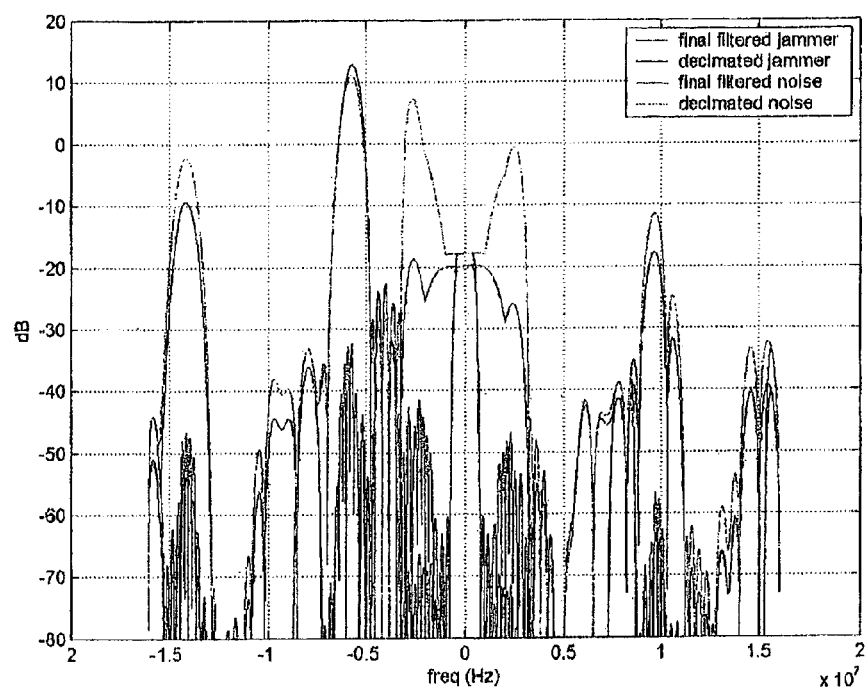
FIG. 15 is a plot of dB versus frequency.

After applying the decimation filter and the receiver filter, the noise and jammer are shown in FIG. 15. Clearly, both requirements are met for noise and jammer, In particular, the jammer and noise after all filters is more than 25 dB below the signal. The only exception is the in-band noise and jammer. therefore, the decimation filters meet the requirements and do not cause noticeable performance loss.

With respect to dynamic scaling, this is used to fill up the entire dynamic range of the filter output. Dynamic scaling includes steps such as those shown in FIG. 16. The input samples arrive at a scaling block 1602 at a rate of 4 MHz. The output ratio is the same. However, most of the gain computation blocks, such as the smoothing filter, gain estimation, and gain hysterysis, run at 1 MHz. The gain values are received from the gain calculation block after the receiver filter. The output of gain calculation block is used to keep the signal level substantially constant (after removing various interferences). The functionality of scaling block 1602 includes scaling the input samples with resolution less than 1 dB. Let the input and output samples be denoted by u and v respectively, The algorithm used for scaling includes: representing $G=8n_1+n_2$, where $n_2$ is a non-negative modulo-8 integer (i.e., 0 $n_2$ 7), and 0 $n_1$ 15; and computing $$v = u \cdot 2^{n-1} \cdot \left(1 + \frac{n_2}{8}\right).$$

Note that the gain steps are not uniform. The largest step is 1 dB and the smallest is 0.5 dB. With respect to the word length, the input is ($P_1$+1)-bits wide, and the output is saturated to ($P_1$+1)-bits.

Figure 16:
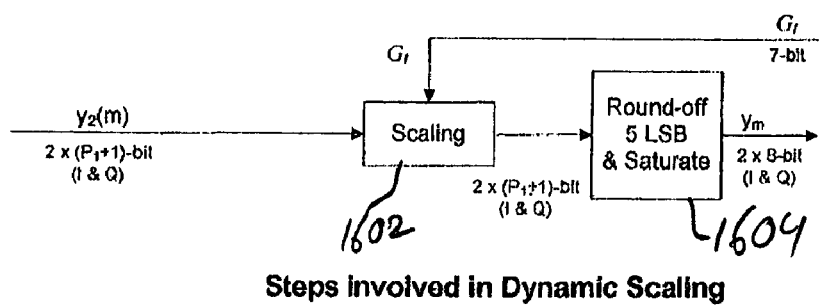
FIG. 16 is a schematic block diagram illustrating an arrangement for dynamic scaling in accordance with the present invention.

With respect to the round-off function of block 1604 in FIG. 16, five least significant bits are rounded-off from the scaled component of the dynamically scaled result. The output is an 8-bit wide value. A saturation algorithm is used for the rounding-off. More particularly, $P_1$ can be either 12 or 13. In both cases just five least significant bits are rounded-off. But when $P_1$ is 13, then one most significant bit is also saturated so that the final word length remains an 8-bit value. Elaborating:

When $P_1$=12, the word length after scaling equals $P_1$+1=13; five least significant bits are rounded off; and the final word length is eight bits.

When $P_1$=13, the word length after scaling equals $P_1$+1=14; five least significant bits are rounded off; one most significant bit is rounded off; and the final word length is eight bits.

CONCLUSION

Described herein are methods and apparatus for converting an analog IF signal in a radio receive channel to a digital signal in a manner that reduces the dependence on precision components, trimming, tuning, and semiconductor manufacturing technologies.

Various embodiments of the present invention may be used in integrated circuit radios that perform at least a portion of the required filtering in the digital domain.

It is to be understood that the present invention is not limited to the embodiments described above, but encompasses any and all embodiments within the scope of the subjoined Claims and their equivalents.

What is claimed is:

1. An analog-to-digital converter, comprising:
a delta-sigma modulator having a first terminal adapted to receive an analog signal, and a plurality of second terminals for providing a multi-bit digital output signal, the delta-sigma modulator comprising:
   a loop filter having a plurality of serially coupled integrators, and
   a multi-bit quantizer coupled to the loop filter; the multi-bit quantizer comprising an analog-to-digital converter (ADC) operable to produce the multi-bit digital output signal, the ADC coupled to a digital-to-analog converter (DAC) having dual DAC feedback loops, and a dynamic element matching function;
a first digital decimation filter coupled to the plurality of second terminals of the delta-sigma modulator to receive the multi-bit digital output signal, the first digital decimation filter operable to provide an output In accordance with the relation:

$$y_1(m) = \sum_{t=0}^{L_1-1} h_1(t) \cdot x(4m-t)$$

where the first digital decimation filter coefficients are represented as $h_1(t)$, $0 \leq t \leq L-1$;
a second digital decimation filter coupled to the first digital decimation filter, the second digital decimation filter operable to provide an output In accordance with the relation:

$$y_3(m) = \sum_{t=0}^{L3-1} h_3(t) \cdot y_2'(2m-t)$$

where the second digital decimation filter coefficients are represented as $h_3(t)$, $0 \leq t \leq L_3-1$;
wherein the loop filter comprises five serially coupled integrators, and further include a first feedback path between an output of the fifth integrator and an input of the fifth integrator, and a second feedback path between an output of the third integrator and an input of the third integrator.

2. The analog-to-digital converter of claim 1, wherein the loop filter is coupled to a difference circuit that is operable to provide an analog signal representative of a difference between the output of the DAC and an intermediate frequency (IF) input signal.

3. The analog-to-digital converter of claim 1, wherein the IF input signal is provided by a radio receive channel mixer coupled to the difference circuit.

4. The analog-to-digital converter of claim 1, wherein the first digital decimation filter coefficients and the second digital decimation filter coefficients are stored in a memory and that memory comprises at least one of the memory circuits in the group consisting of volatile memory, static random access memory, dynamic random access memory, non-volatile memory, read-only memory, flash memory, writeable memory, fuse-based memory, anti-fuse-based memory, and combinations of the foregoing.

5. The analog-to-digital converter of claim 1, further comprising an I/Q imbalance correction circuit coupled to the first digital decimation filter, the I/Q imbalance correction circuit operable to correct I/Q phase and amplitude imbalances.

6. The analog-to-digital converter of claim 1, further comprising a dynamic scaling module coupled to the second digital decimation filter, and operable to estimate the power of a filtered output and to find an inversely proportional gain with which to scale that output.

7. A radio receiver channel, comprising:
a first intermediate frequency (IF) source; and
a first bandpass delta-sigma analog-to-digital converter coupled to the IF source, and the bandpass delta-sigma analog-to-digital converter having a plurality of terminals for providing a multi-bit digital output signal,
the bandpass delta-sigma analog-to-digital converter comprising:
   a loop filter having a plurality of serially coupled integrators, and
   a multi-bit quantizer coupled to the loop filter; the multi-bit quantizer comprising an analog-to-digital converter (ADC) operable to produce the multi-bit digital output signal, the ADC coupled to a digital-to-analog converter (DAC) having dual DAC feedback loops, and a dynamic element matching function; and
a first digital decimation filter coupled to the plurality of second terminals of the delta-sigma modulator to receive the multi-bit digital output signal, the first digital decimation filter operable to provide an output In accordance with the relation:

$$y_1(m) = \sum_{t=0}^{L_1-1} h_1(t) \cdot x(4m-t)$$

where the first digital decimation filter coefficients are represented as $h_1(t)$, $0 \leq t \leq L-1$; and
a second digital decimation filter coupled to the first digital decimation filter;
wherein the second digital decimation filter is operable remove adjacent channel interference and out-of-band quantization noise.

8. A radio receiver channel, comprising
an in-phase intermediate frequency (IF) source;
a first delta-sigma modulator coupled to the in-phase IF source, and the first delta-sigma modulator having a plurality of terminals for providing a first multi-bit digital output signal;
a quadrature IF source;
a second delta-sigma modulator coupled to the quadrature IF source, and the second delta-sigma modulator having a plurality of terminals for providing a second multi-bit digital output signal;
a first digital decimation filter coupled to receive the first and second multi-bit digital output signals in parallel, the first digital decimation filter adapted to provide an output signal including an I component and a Q component;

a second decimation filter coupled to receive the I and Q components of the first digital decimation filter;

an I/Q phase and amplitude imbalance correction circuit coupled to the first digital decimation filter; and a dynamic scaling module coupled to the second digital decimation filter.

9. An analog-to-digital converter, comprising:

a delta-sigma modulator having a first terminal adapted to receive an analog signal, and at least a second terminal adapted to provide a digital output signal, the delta-sigma modulator including a fifth order loop filter with a feedback path between the output and input of a fifth integrator, and a feedback path between the output and input of a third integrator, and a multi-bit quantizer coupled to the loop filter, the multi-bit quantizer including dual DAC feedback paths with dynamic element matching; and a digital decimation filter coupled to at least the second terminal of the delta-sigma modulator;

wherein the digital decimation filter comprises:

a source of finite impulse response coefficients;

a barrel shifter coupled to the source of finite impulse response coefficients, the barrel shifter having a plurality of terminals adapted to receive a corresponding plurality of signals from the source of finite impulse response coefficients, a plurality of terminals adapted to provide a plurality of finite impulse response coefficients, and a plurality of input terminals adapted to receive a corresponding plurality of control signals;

a plurality of computational resources, each computational resource adapted to receive at least one finite impulse response coefficient, the digital output signal of the delta-sigma modulator; and a multiplexer adapted to receive an output signal from each of the plurality of computational resources, and adapted to receive a plurality of output selection control signals.

10. The analog-to-digital converter of claim 9, wherein the source of finite impulse response coefficients comprises a memory selected from the group consisting of non-volatile memory and volatile memory.

11. The analog-to-digital converter of claim 9, wherein the computational resource comprises an arithmetic logic unit (ALU).

12. The analog-to-digital converter of claim 9, wherein the digital output signal of the delta-sigma modulator comprises a plurality of bits, each of the finite impulse response coefficients comprise a plurality of bits, and wherein the arithmetic logic unit comprises:

a first Booth multiply encoder adapted to receive the plurality of bits of the finite impulse response coefficient, and a first portion of the plurality of bits of the digital output signal of the delta-sigma modulator;

a second Booth multiply encoder adapted to receive the plurality of bits of the finite impulse response coefficient, and a second portion of the plurality of bits of the digital output signal of the delta-sigma modulator;

a carry-save adder coupled to, and adapted to receive the multi-bit outputs of, each of the first and second Booth multiply encoders;

a carry-lookahead adder coupled to the carry-save adder; and a register coupled to, and adapted to receive, a multi-bit output of the carry-lookahead adder, the register providing a multi-bit output signal;

wherein the multi-bit output signal of the register is coupled to the carry-save adder, and a subset of the multi-bit output signal of the register is provided for coupling the multiplexer.

13. The analog-to-digital converter of claim 12, wherein the barrel shifter is adapted to shuffle the finite impulse response coefficients to each of the plurality of ALUs.

* * * * *